(12) United States Patent
Jacobsson

(10) Patent No.: US 11,191,199 B2
(45) Date of Patent: *Nov. 30, 2021

(54) METHOD AND DEVICE FOR AUTOMATIC STORAGE OF TAPE GUIDES

(71) Applicant: Mycronic AB, Täby (SE)

(72) Inventor: Nils Jacobsson, Stockholm (SE)

(73) Assignee: Mycronic AB, Taby (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/595,419

(22) Filed: Oct. 7, 2019

(65) Prior Publication Data

US 2020/0253099 A1 Aug. 6, 2020

Related U.S. Application Data

(63) Continuation of application No. 16/167,518, filed on Oct. 22, 2018, now Pat. No. 10,440,867, which is a
(Continued)

(51) Int. Cl.
*H05K 13/00* (2006.01)
*H05K 13/08* (2006.01)
(Continued)

(52) U.S. Cl.
CPC ......... *H05K 13/0084* (2013.01); *B65D 19/00* (2013.01); *B65D 85/62* (2013.01);
(Continued)

(58) Field of Classification Search
CPC .... H05K 13/08; H05K 13/0084; H05K 13/00; H05K 13/04; H05K 13/086; H05K 13/087; B65D 19/00; B65D 85/62; B65G 1/06
(Continued)

(56) References Cited

U.S. PATENT DOCUMENTS 3,310,178 A * 3/1967 Wright ............... B65H 49/32
211/40
4,371,078 A * 2/1983 Hunt ..................... H05K 13/04
206/480
(Continued)

FOREIGN PATENT DOCUMENTS

CN 2409750 Y 12/2000
CN 1550127 A 11/2004
(Continued)

OTHER PUBLICATIONS

PCT/EP2013/055049—International Search Report dated Aug. 6, 2013, 3 pages.
(Continued)

*Primary Examiner* — Patrick D Hawn
(74) *Attorney, Agent, or Firm* — Haynes Beffel & Wolfeld, LLP; Ernest J. Beffel, Jr.

(57) ABSTRACT

A system and method for surface mount assembly of PCB's, using an automated pick-and-place machine into which component tapes on reels are fed, uses component tape reels each of which has been pre-threaded into its appropriate tape guide and been stored as a reel/tape guide packet in an automated SMD storage tower, from which appropriate packets are retrieved for coupling to the pick-and-place machine.

17 Claims, 6 Drawing Sheets

Related U.S. Application Data continuation-in-part of application No. 14/385,143, filed as application No. PCT/EP2013/055050 on Mar. 12, 2013, now Pat. No. 10,111,369, which is a continuation-in-part of application No. 14/385,146, filed as application No. PCT/EP2013/055049 on Mar. 12, 2013, now Pat. No. 10,178,819.

(60) Provisional application No. 61/764,334, filed on Feb. 13, 2013, provisional application No. 61/609,691, filed on Mar. 12, 2012, provisional application No. 61/764,334, filed on Feb. 13, 2013, provisional application No. 61/609,691, filed on Mar. 12, 2012.

(51) Int. Cl.
*B65D 19/00* (2006.01)
*B65D 85/62* (2006.01)
*B65G 1/06* (2006.01)

(52) U.S. Cl.
CPC .............. *B65G 1/06* (2013.01); *H05K 13/08* (2013.01); *H05K 13/086* (2018.08); *H05K 13/087* (2018.08)

(58) Field of Classification Search
USPC ................................... 242/595; 29/739, 740
See application file for complete search history.

(56) References Cited

U.S. PATENT DOCUMENTS

| | | | | |
|---|---|---|---|---|
| 4,438,559 A * | 3/1984 | Asai | ................. | H05K 13/0419 29/740 |
| 4,473,935 A * | 10/1984 | Tatsuura | ................. | B23P 19/00 198/346.1 |
| 4,573,589 A * | 3/1986 | Atkinson | ............. | G11B 23/027 211/41.12 |
| 4,579,231 A * | 4/1986 | Price | ................... | G11B 23/027 211/162 |
| 4,617,733 A * | 10/1986 | Olson | ................... | H01R 43/00 29/825 |
| 4,773,547 A * | 9/1988 | Bell | .................... | A47B 87/0215 108/53.1 |
| 5,235,164 A | 8/1993 | Noyama et al. | | |
| 5,303,214 A | 4/1994 | Kulakowski et al. | | |
| 5,319,621 A * | 6/1994 | Amar | ................... | G11B 17/30 360/98.06 |
| 5,319,846 A | 6/1994 | Takahashi et al. | | |
| 5,321,885 A * | 6/1994 | Hino | ................... | B23P 21/004 29/832 |
| 5,411,153 A * | 5/1995 | Unfried | ............. | A47B 87/0215 108/180 |
| 5,456,001 A * | 10/1995 | Mori | ................... | H05K 13/086 29/739 |
| 5,697,684 A * | 12/1997 | Gyovai | ............. | G11B 33/0477 312/9.42 |
| 5,718,339 A * | 2/1998 | Woodruff | ............. | G11B 15/688 211/41.12 |
| 5,746,139 A * | 5/1998 | Villanueva | ............. | A47B 45/00 108/102 |
| 5,764,615 A * | 6/1998 | Ware | ................... | G11B 15/6835 360/92.1 |
| 5,809,639 A * | 9/1998 | Alvite | ................. | H05K 13/021 29/740 |
| 5,971,174 A * | 10/1999 | Strock | ................. | A47B 87/008 211/186 |
| 6,015,050 A * | 1/2000 | Gilbertson | ......... | G11B 33/0483 211/188 |
| 6,059,216 A * | 5/2000 | Ogura | ................. | B65H 16/02 242/422.5 |
| 6,072,766 A * | 6/2000 | Konshak | ............. | G11B 15/688 369/30.5 |
| 6,279,763 B1 * | 8/2001 | Bush | ................... | A47B 43/00 108/55.1 |
| 6,356,352 B1 * | 3/2002 | Sumi | ................... | H05K 13/04 29/700 |
| 6,368,045 B1 * | 4/2002 | Ashman | ............. | B65H 41/00 414/411 |
| 6,539,622 B2 * | 4/2003 | Hidese | ............... | H05K 13/0419 29/832 |
| 6,546,619 B1 * | 4/2003 | Shichi | ................. | H05K 13/087 29/837 |
| 6,631,552 B2 * | 10/2003 | Yamaguchi | ......... | H05K 13/0813 29/739 |
| 6,631,870 B2 * | 10/2003 | Bergstrom | ........... | H05K 13/086 242/615 |
| 6,782,606 B2 * | 8/2004 | Bergstrom | ......... | H05K 13/0419 29/740 |
| 6,801,834 B1 * | 10/2004 | Konshak | ............. | G11B 17/225 414/273 |
| 6,918,730 B2 | 7/2005 | Kawai et al. | | |
| 6,971,157 B1 * | 12/2005 | Yoshida | ............. | H05K 13/0452 29/739 |
| 6,996,440 B2 * | 2/2006 | Maenishi | ........... | H05K 13/0452 700/28 |
| 7,021,357 B2 * | 4/2006 | Katano | ................ | B23Q 7/1473 156/556 |
| 7,228,620 B2 | 6/2007 | Bergstrom | | |
| 7,562,440 B2 * | 7/2009 | Ito | ....................... | H05K 13/0215 29/739 |
| 7,854,332 B1 * | 12/2010 | Clausen | ................. | G11B 17/22 211/41.12 |
| 7,899,561 B2 * | 3/2011 | Maenishi | ........... | H05K 13/0853 700/28 |
| 7,930,819 B2 * | 4/2011 | Yonemitsu | ......... | H05K 13/0417 29/739 |
| 7,930,821 B2 * | 4/2011 | Nies | .................... | H05K 13/0069 29/832 |
| 7,938,929 B2 * | 5/2011 | Minamitani | ......... | H01L 24/75 156/299 |
| 8,002,128 B2 * | 8/2011 | Kern | ................... | B65D 19/12 211/194 |
| 8,179,259 B2 | 5/2012 | Bolotin et al. | | |
| 8,327,775 B2 * | 12/2012 | Harris | ................. | B65D 19/385 108/53.3 |
| 8,375,571 B2 * | 2/2013 | Mtchedlishvili | ........ | H05K 13/04 29/743 |
| 8,528,196 B2 * | 9/2013 | Kosaka | ................ | H01L 24/97 29/832 |
| 8,764,935 B2 | 7/2014 | Kinoshita et al. | | |
| 8,857,634 B2 * | 10/2014 | Harris | ................. | B65D 19/385 211/194 |
| 8,911,063 B2 * | 12/2014 | Watanabe | ......... | H01L 21/67051 347/68 |
| 9,340,322 B2 * | 5/2016 | Harris | ................. | A47B 47/028 |
| 9,492,009 B2 * | 11/2016 | Naka | .................... | A47B 47/021 |
| 10,111,369 B2 * | 10/2018 | Jacobsson | ............ | H05K 13/086 |
| 10,440,867 B2 * | 10/2019 | Jacobsson | ............ | B65D 19/00 |
| 2001/0003865 A1 * | 6/2001 | Hata | ..................... | H05K 13/041 29/743 |
| 2002/0014002 A1 * | 2/2002 | Bergstrom | ........... | H05K 13/087 29/740 |
| 2002/0030597 A1 * | 3/2002 | Muirhead | ............... | B29C 65/18 340/572.1 |
| 2003/0000959 A1 * | 1/2003 | Desai | ................... | H05K 13/021 221/282 |
| 2003/0088974 A1 * | 5/2003 | Nakamura | ............. | H05K 13/02 29/740 |
| 2004/0193302 A1 * | 9/2004 | Kou | ..................... | H05K 13/0882 700/114 |
| 2004/0237474 A1 * | 12/2004 | Gregerson | ......... | H05K 13/0084 53/453 |
| 2006/0085973 A1 * | 4/2006 | Kodama | ................. | H05K 3/305 29/740 |
| 2006/0088405 A1 * | 4/2006 | Leimbach | ................ | B65G 1/14 414/801 |
| 2008/0147232 A1 * | 6/2008 | Kuribayashi | ........ | H05K 13/087 700/160 |

(56) References Cited

U.S. PATENT DOCUMENTS

| | | | |
|---|---|---|---|
| 2008/0193247 A1* | 8/2008 | Zupancich | B65D 19/10 410/92 |
| 2008/0217394 A1* | 9/2008 | Okada | H05K 13/0417 235/375 |
| 2010/0014948 A1* | 1/2010 | Higashida | H05K 13/0434 414/222.05 |
| 2010/0075534 A1* | 3/2010 | Mtchedlishvili | H05K 13/04 439/578 |
| 2010/0256801 A1 | 10/2010 | Ohno | |
| 2012/0325885 A1* | 12/2012 | Nagao | H05K 13/0419 226/76 |
| 2013/0133187 A1* | 5/2013 | Yman | H05K 13/0406 29/739 |
| 2013/0145597 A1* | 6/2013 | Kodama | G05B 19/41805 29/428 |
| 2015/0075724 A1* | 3/2015 | Karlsson | H05K 13/0419 156/538 |
| 2015/0098774 A1* | 4/2015 | Jacobsson | H05K 13/08 414/273 |
| 2015/0245497 A1* | 8/2015 | Iwata | H05K 13/0434 29/832 |
| 2016/0205819 A1 | 7/2016 | Jacobsson et al. | |
| 2016/0212899 A1 | 7/2016 | Jacobsson et al. | |
| 2016/0234985 A1 | 8/2016 | Jacobsson et al. | |
| 2016/0234986 A1 | 8/2016 | Jacobsson et al. | |
| 2018/0179017 A1* | 6/2018 | Kobayashi | B65H 49/24 |

FOREIGN PATENT DOCUMENTS

| | | | |
|---|---|---|---|
| CN | 1951164 | A | 4/2007 |
| CN | 101032199 | A | 9/2007 |
| CN | 101272677 | A | 9/2008 |
| CN | 101287359 | A | 10/2008 |
| CN | 101518173 | A | 8/2009 |
| CN | 101861090 | A | 10/2010 |
| CN | 102016611 | A | 4/2011 |
| CN | 102036545 | A | 4/2011 |
| DE | 4222709 | A1 | 6/1993 |
| DE | 4434383 | A1 | 3/1996 |
| EP | 1147697 | A1 | 10/2001 |
| EP | 1381265 | A1 | 1/2004 |
| EP | 1928221 | A2 | 6/2008 |
| GB | 2262516 | A | 6/1993 |
| JP | H10329866 | A | 12/1998 |
| JP | 3100442 | U | 5/2004 |
| JP | 2005089041 | A | 4/2005 |
| WO | 03/024181 | A1 | 3/2003 |

OTHER PUBLICATIONS

PCT/EP2013/055049—International Preliminary Report on Patentability and Written Opinion dated Sep. 16, 2014, 10 pages.
PCT/EP2013/055050—International Preliminary Report on Patentability and Written Opinion dated Sep. 10, 2014.
PCT/EP2013/055050—International Search Report dated Nov. 11, 2013, 6 pages.
CN 201380023562.1—Second Office Action, dated Oct. 13, 2016, 8 pages.
CN 201380023521.2, Second Office Action, dated Oct. 17, 2016, 11 pages.
U.S. Appl. No. 14/385,146—Office Action dated Feb. 11, 2016, 10 pages.
U.S. Appl. No. 14/385,146—Final Office Action dated Sep. 2, 2016, 10 pages.
U.S. Appl. No. 14/385,146—Response to Final Office Action dated Sep. 2, 2016, filed Dec. 2, 2016, 16 pages.
U.S. Appl. No. 14/385,146—Final Office Action dated Jul. 7, 2017, 9 pages.
U.S. Appl. No. 14/385,146—Non-final Office Action dated Dec. 23, 2016, 12 pages.
U.S. Appl. No. 14/385,146—Response to Non-final Office Action dated Dec. 23, 2016, filed May 19, 2017, 16 pages.
U.S. Appl. No. 14/385,143—Office Action dated Apr. 11, 2016, 15 pages.
U.S. Appl. No. 14/385,143—Final Office Action dated Nov. 17, 2016, 9 pages.
U.S. Appl. No. 14/385,143—Response to Final Office Action dated Nov. 17, 2016, filed Jan. 17, 2017, 17 pages.
U.S. Appl. No. 14/385,143—Advisory Action dated Jan. 31, 2017, 11 pages.
U.S. Appl. No. 14/385,143—Resppnse to Advisory Action dated Jan. 31, 2017, filed May 11, 2017, 16 pages.
U.S. Appl. No. 14/385,143—Non-final Office Action dated Oct. 4, 2017, 15 pages.
U.S. Appl. No. 14/385,146—Response to Final Office Action dated Jul. 7, 2017, filed Jan. 5, 2018, 21 pages.
U.S. Appl. No. 14/385,146—Nonfinal Office Action dated Jan. 25, 2018, 9 pages.
EP13711859.2—Office action dated Mar. 5, 2018, 9 pages.
EP13711859.2—Response to Office action dated Mar. 5, 2018, 19 pages.
EP13711859.2—Office action dated Jan. 22, 2019, 8 pages.
EP13711859.2—Response to Office action dated Jan. 22, 2019, 13 pages.
EP13711859.2—Office action dated Jan. 2, 2020, 4 pages.
EP13711859.2—Response to Office action dated Jan. 2, 2020, 10 pages.
EP13709417.3—Response Office action dated Jan. 2, 2018, 7 pages.
EP13709417.3—Office action dated Jan. 2, 2018, 6 pages.

* cited by examiner

METHOD AND DEVICE FOR AUTOMATIC STORAGE OF TAPE GUIDES

PRIORITY AND RELATED APPLICATION STATEMENTS

This application is a continuation of U.S. application Ser. No. 16/167,518, filed 22 Oct. 2018, titled "METHOD AND DEVICE FOR AUTOMATIC STORAGE OF TAPE GUIDES" (MYDT 1006-11), which is a continuation of U.S. application Ser. No. 14/385,143, filed 12 Sep. 2014, titled "METHOD AND DEVICE FOR AUTOMATIC STORAGE OF TAPE GUIDES", now U.S. Pat. No. 10,111,369, issued 23 Oct. 2018 (MYDT 1006-5), which is the US national stage of PCT Application No. PCT/EP2013/055050, filed Mar. 12, 2013, titled "METHOD AND DEVICE FOR AUTOMATIC STORAGE OF TAPE GUIDES" which claims priority to U.S. Provisional Patent Application No. 61/609,691 filed Mar. 12, 2012 titled "STORING PALLETS WITH RANDOM HEIGHT IN A SHELF LESS STORAGE UNIT" (MYDT 1006-1/P00392b), to U.S. Provisional Patent Application No. 61/764,334 filed Feb. 13, 2013 titled "METHOD, SYSTEM AND DEVICE FOR AUTOMATED STORAGE AND RETRIEVAL OF COMPONENT TAPE REEL AND TAPE GUIDE UNIT IN AN AUTOMATED STORAGE UNIT, A SHELFLESS SMD STORAGE UNIT AND A SYSTEM AND METHOD FOR AUTOMATED HANDLING OF COMPONENT FEEDER AND REEL PACKAGE" (MYDT 1006-2/P00392a). U.S. application Ser. Nos. 16/167,518 and 14/385,143 are hereby incorporated by reference for all purposes, together with the amendments of Aug. 11, 2016, May 11, 2017 a and Feb. 5, 2018 to the specification of Ser. No. 14/385,143 and the amendments of Aug. 11, 2016 and Feb. 5, 2018 to the drawings of Ser. No. 14/385,143.

This application is a continuation of U.S. application Ser. No. 16/167,518, filed 22 Oct. 2018, titled "METHOD AND DEVICE FOR AUTOMATIC STORAGE OF TAPE GUIDES" (MYDT 1006-11), which is also a continuation-in-part of U.S. application Ser. No. 14/385,146, filed 12 Sep. 2014, titled "METHOD AND DEVICE FOR AUTOMATIC STORAGE OF ELECTRONIC COMPONENTS", now U.S. Pat. No. 10,178,819, issued 8 Jan. 2019 (MYDT 1006-6), which is the US national stage of PCT Application No. PCT/EP2013/055049, filed Mar. 12, 2013, titled "METHOD AND DEVICE FOR AUTOMATIC STORAGE OF ELECTRONIC COMPONENTS" which claims priority to U.S. Provisional Patent Application No. 61/609,691 filed Mar. 12, 2012 titled "STORING PALLETS WITH RANDOM HEIGHT IN A SHELF LESS STORAGE UNIT" (MYDT 1006-1/P00392b), to U.S. Provisional Patent Application No. 61/764,334 filed Feb. 13, 2013 titled "METHOD, SYSTEM AND DEVICE FOR AUTOMATED STORAGE AND RETRIEVAL OF COMPONENT TAPE REEL AND TAPE GUIDE UNIT IN AN AUTOMATED STORAGE UNIT, A SHELFLESS SMD STORAGE UNIT AND A SYSTEM AND METHOD FOR AUTOMATED HANDLING OF COMPONENT FEEDER AND REEL PACKAGE" (MYDT 1006-2/P00392a). Pursuant to the amendment submitted May 19, 2017, the three priority applications identified in this paragraph are hereby incorporated by reference for all purposes, together with the amendment of May 19, 2017 to the specification and the amendment of Jun. 13, 2016 to the drawings of Ser. No. 14/385,146.

TECHNICAL FIELD

The technology disclosed generally relates to the storage and retrieval of parts or materials used in the automated manufacturing of circuit boards. More specifically, the technology disclosed relates to efficient storage and retrieval of component carriers in automatic storage unit to be used in the electronic component assembly process.

BACKGROUND ART

Electronic components come in many different sizes. A common way of delivering the components is on tape using a reel adapted to a certain type of tape, e.g. the width or size of the tapes. The tapes which carry the components come in different predefined widths, e.g. 8, 12, 16, 24, 23, 44 mm et cetera. Because the different types of reels stored in a storage unit have different widths, they also have different eights when stored horizontally in the storage unit.

Surface Mount Technology is now the preferred method of automated production of electronic printed circuit boards. So-called pick-and-place robotic machines are used in the process of placing and soldering electronic components to a printed circuit board (PCB). A plurality of pneumatic nozzles on small robot arms in the pick-and-place machine use suction to pick up a required component, such as a capacitor or a complete integrated circuit, and place them on a board, after jet spraying a pattern of adhesive on the board.

Machines for pick-and-place mounting of components on a substrate, such as a Printed Circuit Board (PCB), or a substrate for a System in Package (SiP) component are subject to different, often contradictory demands, such as mounting speed, mounting precision, size, price, etc. The expression "pick and place" is understood by the person skilled in the art as describing the very mounting operation where a mounting head is moved to a component feeder area, where the mounting head picks one or more components from one or more of the component feeders, and then is moved to a mounting area where the mounting head places the component or components on the substrate.

Such machines are capable of picking and placing upwards of 30000 components per hour on boards. Supplies of a certain type of component, such as a certain specified type of capacitor, resistor, diode or IC, are often delivered on trays of one type of component or on sticks or, as has become most common today, on tapes in reels with a series of pockets of appropriate depth in the tape, holding one component in each pocket. The reels have varying widths between 8 mm and 44 mm. A row of reels, each representing a different type of component, are placed in a magazine and feed components into the machine as the nozzle arms rapidly pick components out of their pockets and place them on the board. Component manufacturers deliver the components in standard reels of pocket-tape with a thin cover tape, or film, closing the pockets. This pocket cover tape must be removed by some method before the component can be picked out of its pocket.

Tape guides or feeders are used to feed the tape into the pick-and-place machine as the components are picked out of the pockets. One such tape guide is described EP 1 381 265 B1, incorporated herein by reference. This type of component tape guide as no built-in tape advancing place machine so that a feeding wheel in the pick-and-place machine protrudes through the tape guide into contact with the pre-threaded tape.

Each tape guide has a specific identity in relation to the pick-and-place machine and in whatever sequential position the reel with its pre-threaded ape is placed in the machine, the mounting machine robotics will properly find and pick up the proper components from the tape pockets. A method of associating the identity of the tape guide used to the specifics of the components in the tape threaded into the guide is described in EP 1 147 697 B1, incorporated herein by reference.

As known, the electronic components and in particular, SMD components, intended to be mounted on electronic boards in order to carry out precise functions, are wound in tapes or reels which are placed in stores or cabinets suitable for storage.

The single reels of SMD components, stored in said stores, are identified by a special code, for example of the bar type, which contains all the information relating to the type of electronic components contained in the single reels and the information relating to the location of the same reels in the store.

The reels of SMD components are managed in such stores according to manual, semi-automatic or automatic logics. In the case of a manual store, when the operator needs electronic components suitable for making an electronic board, he/she looks for the reel(s) into the store itself by the identification code and manually carries out the pick up and the subsequent replacement of the reels into the store in the positions marked by the code.

In the case of semi-automatic or automatic store, the operator selects the reels he/she needs by the code and the system presents them one by one to the same operator. The pick up and the replacement of the single reels, in the case of a fully automatic store, can take place for example by a mechanical actuator that pick up/replaces the reel from its containment cell or seat.

DISCLOSURE OF INVENTION

The technology disclosed relates to an automatic storage device for storing electronic components and an arrangement, such as a pallet, configured to hold a SMD packet containing a tape guide and a reeled component tape which is pre-threaded into the tape guide. In particular, the technology disclosed relates to an accumulator device especially suitable for being used in automatic or semi-automatic storage devices for storing a plurality of the above-mentioned SMD packets each comprising a tape guide and a reeled component tape carrying electronic components and which is pre-threaded into the tape guide prior to being stored in the automated storage devices.

One of the purposes of the present invention is to achieve a system and a method which simplifies and speeds up the process of surface mounting SMD components on circuit boards, by eliminating process-halting manual tape-loading steps involved in the previously known systems and methods.

Another purpose of the present invention is to achieve a system and a method which better utilizes the available capacity of automatic storage devices, or SMD warehouses, and to facilitate the handling of the tape guides and the component tape reels.

Essential to the technology disclosed is that the tapes are pre-threaded into the proper tape guides before the component tape reel and tape guide is stored together in the automatic storage device.

In one implementation of the technology disclosed, the component tape reels may already be associated by coding, e.g. code linked by bare coding, with its tape guide, which in the continued processing will identify for the pick and place machine the reel with the proper components.

In another implementation of the technology disclosed, the identity of the tape guide is code linked to the particular bar code of the component reel by means of comprised in the automatic storage device, e.g. by a bar code reader in the automatic storage device.

It is envisioned in one implementation of the technology disclosed that the component reel with the pre-threaded tape guide will be coded together and stored on a tray as a unit in an automated SMD storage ware house such as a MYDATA SMD Tower. This system and method have significant advantages over the previous system and method of operating the pick-and-place machine.

Previously, the correct component reel had to be ordered from the SMD warehouse. The correct tape guide (of some 20 different guides) had to be selected by the operator, who is setting up an SMT job. And the bar code of the delivered reel and the identity of the tape guide will have to be linked. Then he will have to thread in the component tape properly, before inserting the tape guide into its proper position in the machine. All of these time-consuming and possibly error-prone steps are eliminated by the system and method according to the invention, whereby each reel tape is pre-threaded into and coded together with the proper tape guide. This pre-threading co-coding and storage in the SMD Tower is done by trained storage personnel, loading and coding an entire SMD Tower with up to 546 reels of component tapes.

It will be recognized that the technology disclosed can be implemented as if the reel and the tape guide are made as an integral unit and are not separable, delivered as a unit by the supplier of electronic components. This integral unit may then comprise a component reel portion and a tape guide portion adapted to guide the component tape to a position where the electric components are pick-up from their respective pockets by the pick-up robot of the pick-and-place machine. The integral unit may also include exposure means for peeling off at least a portion of the cover tape from the component tape. The integral unit can be placed at the port of the automated storage device, SMD Tower, and the internal robot arm will pick up the pallet and deposit it on a specific shelf in the SMD Tower for retrieval at a later time and deposit it at the retrieval port.

In one implementation, it is provided means for temporarily affixing the integral unit to one of a plurality of locations on the interior of an automated storage device comprising at least one of a magnetic, electronic and/or mechanical means of attachment, or coupling means, adapted to interact with a plurality of means of attachment, or coupling means, on the interior of the automated component tape reel storage device to thereby attach the integral tape guide and reel to one of said locations on the interior of said automated storage device. In this further implementation of the technology disclosed, the integral unit will act as its own supporting means for storage at any desired location in the interior of the SMD tower.

In another implementation of the technology disclosed, a dedicated pallet with shape defined areas and/or mechanical holding means, for holding the reel and the pre-threaded tape guide is provided. This pallet/packet can be placed at the port of the automated SMD Tower and the internal robot arm will pick up the pallet and deposit it on a specific position, e.g. a specific shelf, in the SMD Tower for retrieval at a later time and deposit it at the retrieval port.

In this implementation of technology disclosed using a dedicated pallet, the pallet itself can be used as a support means in a storage warehouse such as an SMD Tower with no shelves, only points of attachment in the interior framework of the SMD Tower. Each pallet has, according to one embodiment, a pin integral therewith, which can be inserted into a specific one of many holes in the interior of the SMD tower.

DETAILED DESCRIPTION

Figure 1B:
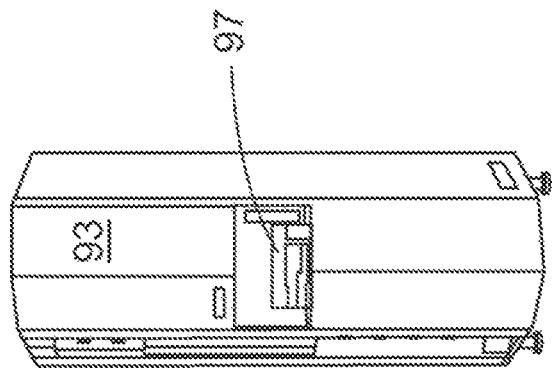
FIGS. 1A and 1B illustrates schematically a system for SMT (Surface Mount Technology) semi-automated mounting of electronic components on printed circuit boards.
Figure 1A:
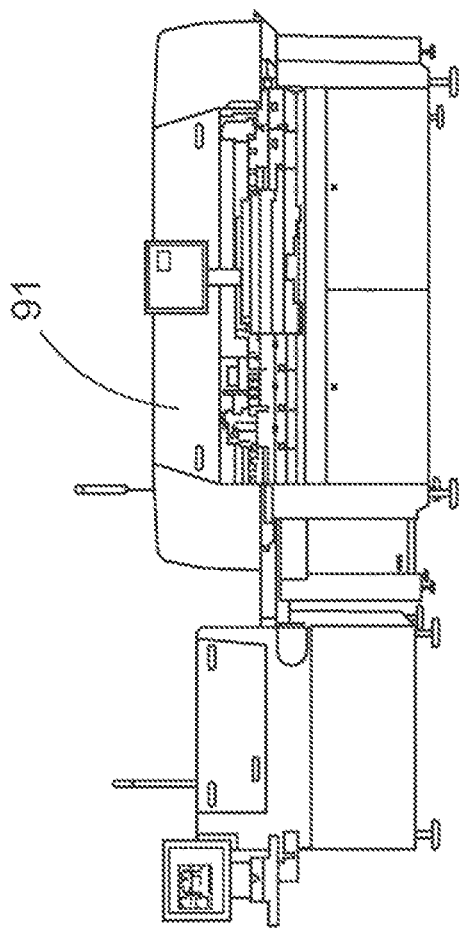

FIGS. 1A and 1B shows schematically the layout of a system centered on a Surface Mount Device (SMD) mounting machine (91, indicated only schematically). Such machines are commonly known as pick-and-lace machines. Boards prepared by jet printing a pattern of solder paste and/or adhesive are advanced through such an SMD mounting machine and robot arms pick up preferably by suction, components fed perpendicularly to the advancing board belt, into one side of the machine by one of three common methods: in a matrix tray, in a component stick carrying one particular type of component or in a component tape consisting of a series of pockets each carrying one particular type of electronic component. The matrix trays, component sticks and tapes can be held in intermediate holders such as a tape magazine or trolley, dockable to the SMD mounting machine or can be mounted directly into the SMD mounting machine.

The discussion below deals with the handling of component tapes on reels in the present system and method. In general, component tapes must be guided into the SMD mounting machine by some form of tape guide. In many systems the tape guide and feeder wheel 8 are built into the SMD mounting machine or the tape magazine and the tape guide cannot be separated from the feeder wheel. In the system under discussion here, which is show and described in EP 1 381 265, incorporated herein by reference, a tape feeder or guide can be pre-threaded with the tape end and be mounted as shown in FIG. 2 so that the tape is feed into the SMD machine by means of the wheel which is in contact with the tape when the tape guide is in its operative position.

Figure 2:
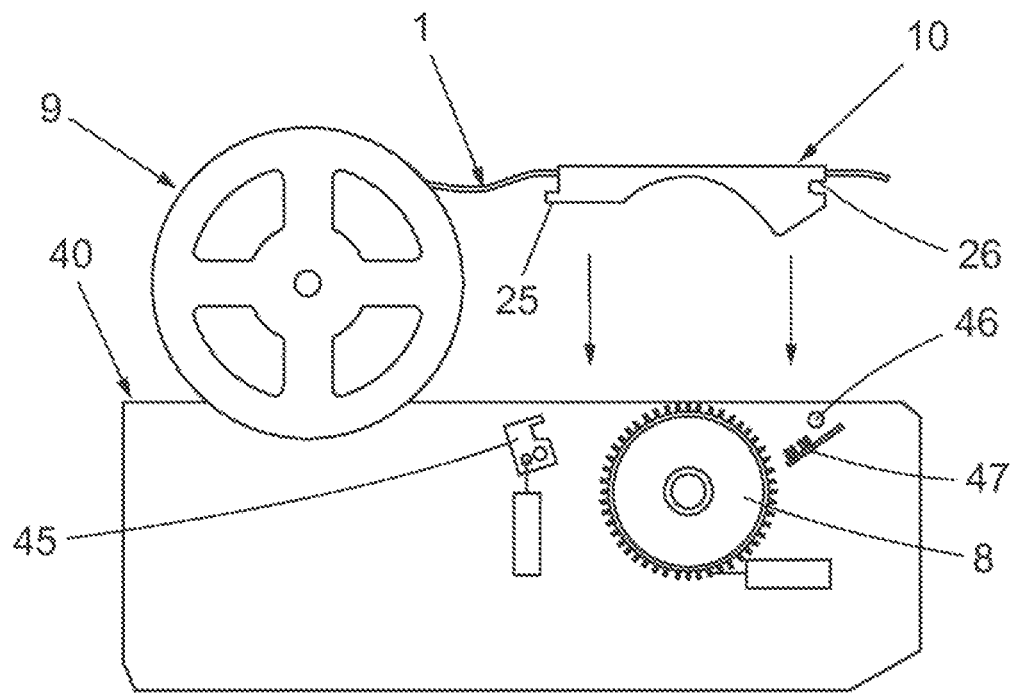
FIG. 2 shows the mounting of reel and tape guide in a magazine.
Figure 3:
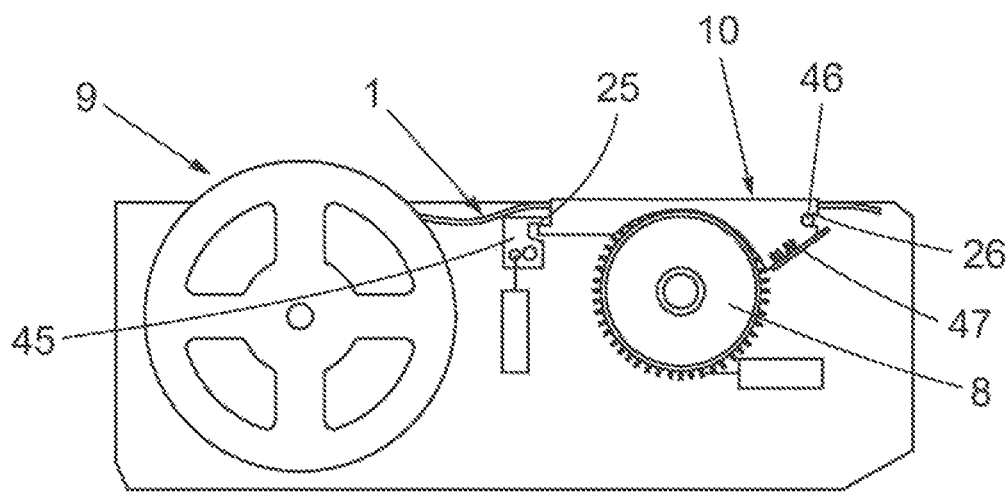
FIG. 3 shows the reel and tape mounted in the magazine as shown in FIGS. 1A and 1B.

There can be seen in FIGS. 2 and 3 the reel 9 holding a component tape 1 threaded in the tape guide 10. The reel 9 and threaded tape guide 10 are being mounted in a magazine 40 with a feeder wheel 8. The tape guide 10 has a hook 25 and a recess 26 for engagement with a catch 45 and a pin respectively for securing the tape guide 10 in the magazine 40. Whether using a small tape guide with no moving parts, selected to fit the particular tape on the reel or a tape guide with a built in advancing wheel, the time consuming and work stopping step has been necessary, of threading the tape before coupling to the machine. The technology disclosed addresses and solves or mitigates the inherent time consuming and work stopping issues associated with prior art automated storage devices and associated methods.

FIG. 3 shows the reel and threaded tape guide inserted into position for tape advancement by the wheel. The tape guide is secured in position by when the pin 26 is engaged in the recess 26 and the catch 45 is moved to its engagement position engaging the hook 25. As will be described in more detail below with reference to FIG. 6, there is an ID contact 47 which individually reads the ID of the inserted tape guide.

In this particular system, each of the individual tape reels necessary for a particular job is placed in proper sequential order in a tape magazine for holding each reel vertical and allowing it to rotate. It has up to now been necessary, to load the machine, to first select a proper tape guide for the reel selected, to link the identity of the tape guide to the particular code of the component reel (So that the machine can "see" where that particular component can be picked up), and to thread the tape through the selected tape guide, whereafter the tape guide is coupled in place in the SMD machine, via hooks 26 and 25.

Figure 4:
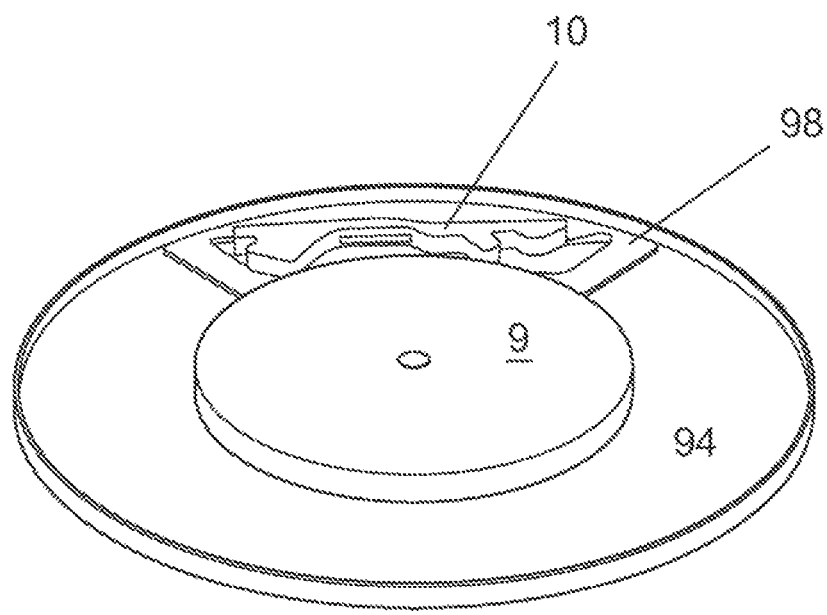
FIG. 4 shows a pallet especially suited for carrying a component tape reel and a tape guide.
Figure 5:
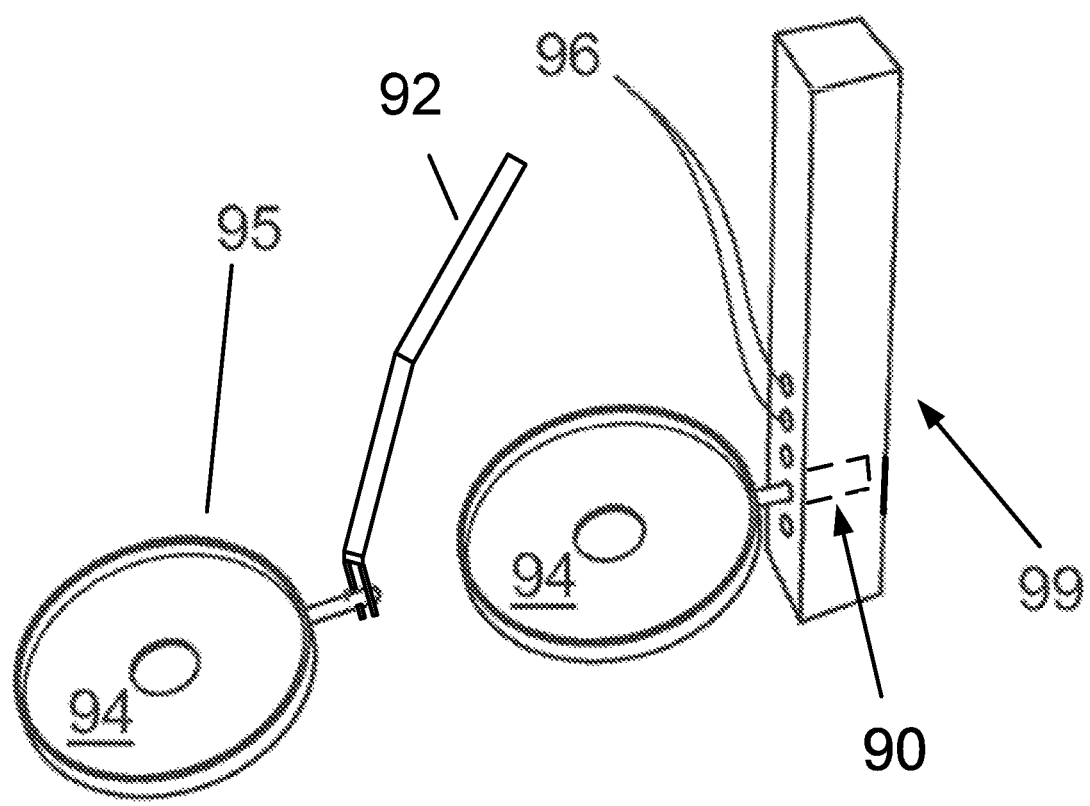
FIG. 5 shows the mounting of such a pallet in a frame of a component storage tower.

FIG. 4 shows in perspective a rimmed pallet 95 with a formed spacer element 98 which defines the exact placement of both the reel 9 and the tape guide 10. This is merely a preferred pallet design not limiting the scope of the invention. Such a pallet is particularly suited to holding a component tape reel with tape together with its tape guide with the tape threaded therethrough, making the handling of this packet particularly efficient in the loading and operation of the pick-and-place machine. In this embodiment with a dedicated pallet as shown in FIG. 4, the pallet itself can be used as a support means in a storage warehouse such as an SMD Tower with no shelves, only points of attachment in the interior framework 99 of the SMD Tower, such as is shown in FIG. 5. Here the points of attachment are holes holds 96 into which a mounting pin 95 on each pallet can be inserted. Continuation of one of the holes 96 into the post 99 is shown by dashed lines 90. With this shelf-less construction, the internal robot arm of the SMD Tower 92, retrieves the pallet 94 at the port 97. The illustration of robot arm is conceptual and not intended to define the size or shape of the robot arm.

Figure 6:
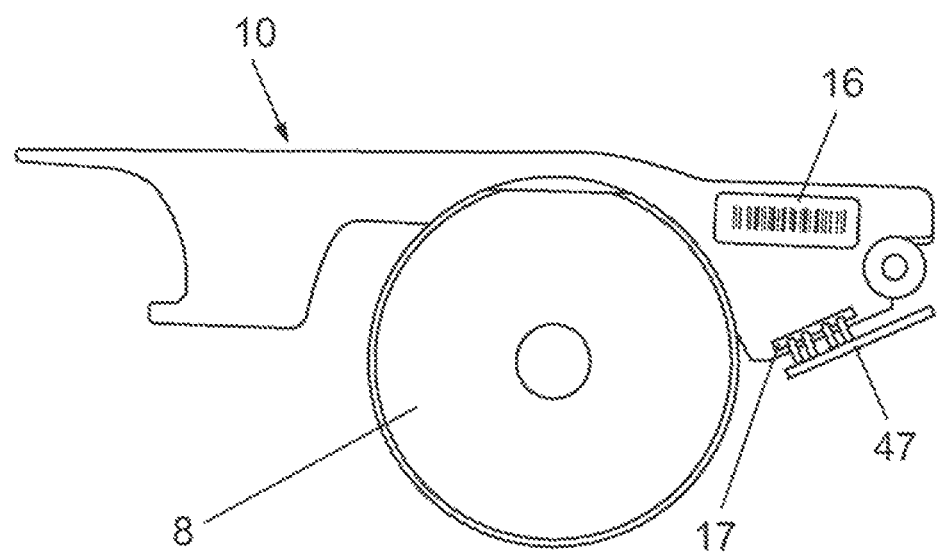
FIG. 6 shows a component reel and tape guide packet comprised in an integral unit.

As shown in FIG. 6, the identity of each tape guide 10 is manifested in a bar code 16 and the tape guide also has a second identification means 17 in the form of an identification circuit. The identification circuit 17 may hold the same information regarding the identity of the tape guide 10 as the bar code 16. The circuit 17 is provided with contact surfaces for connection to contact pins provided on an identity receiving or reading circuit 47. The identity receiving circuit 47 is located in a tape guide magazine 40 or in a component mounting machine. The connection between the identification circuit 17 and the identity receiving circuit 47 is made when mounting the tape guide 10 into the magazine 40 or the component mounting machine. The identity of the tape guide is, according to one implementation of the technology disclosed, associated, "married" (in branch terminology), to the identity of the reel and the particular type of electronic component which it holds. This can be done as the reel/guide packet is deposited at the deposit port of the SMD warehouse or tower. This association or "marriage" can be effected automatically by the tower upon first deposit. As mentioned above, an identity receiving circuit 47 is located in a tape guide magazine 40 or in a component mounting machine and the connection between the identification circuit 17 and the identity receiving circuit 47 in FIG. 6 is then made when mounting the tape guide 10 into the magazine 40 or the component mounting machine. the component mounting machine can then retrieve all information that is associated with the tape guide identity, i.e. both the component tape information and any tape guide information available. This information is retrieved from the above-mentioned database, to which the component mounting machine has access. In certain implementations of the technology disclosed, the tape guide and the component reel are mechanically and/or magnetically attached by separate means of attachment, or affixing means, provided both in the tape guide and the component reel but where the tape guide and the reel are releasably mountable and possible to detach as two separate units.

In another implementation that also may be illustrated by reference to FIG. 6, where integral units each comprising both a tape guide portion and a reel portion 8 are provided, the identity of each tape guide portion of the integral units 10 is manifested in a bar code 16 and the integral unit also has a second identification means 17 in the form of an identification circuit. An identification circuit 17 may hold the same information regarding the identity of the integral unit 10 as the bar code 16, or the bar code could be omitted and the identification circuit 17 may be a bar code which is readable by a bar code reading 47 located in the tape guide magazine 40 or in a component mounting machine or the identification means 17 may be an identification circuit provided with contact surfaces for connections to contact pins provided on an identity receiving or reading circuit 47. Hence, the integral unit identity receiving or reading circuit 47 is located in a tape guide magazine 40 or in a component mounting machine. The connection between the identification circuit 17 and the identity receiving circuit 47 is made when mounting the integral unit 10 into the magazine 40 or the component mounting machine. The identity of the integral unit is, according to one implementation of the technology disclosed, associated, "married" (in branch terminology), to the identity of the reel and the particular type of electronic component which it holds. According to the technology disclosed, this can be done as the reel/guide packet is deposited at the deposit port of the SMD warehouse or tower. This association or "marriage" can be effected automatically by the tower upon first deposit. As mentioned above, an identity receiving circuit 47 is located in a tape guide magazine 40 or in a component mounting machine and the connection between the identification circuit 17 and the identity receiving circuit 47 in FIG. 6 is then made when mounting the integral unit 10 into the magazine 40 or the component mounting machine. The component mounting machine can then retrieve all information that is associated with the tape guide identity, i.e. both the component tape information and any tape guide information available. This information is retrieved from the above-mentioned database, to which the component mounting machine has access.

Figure 7:
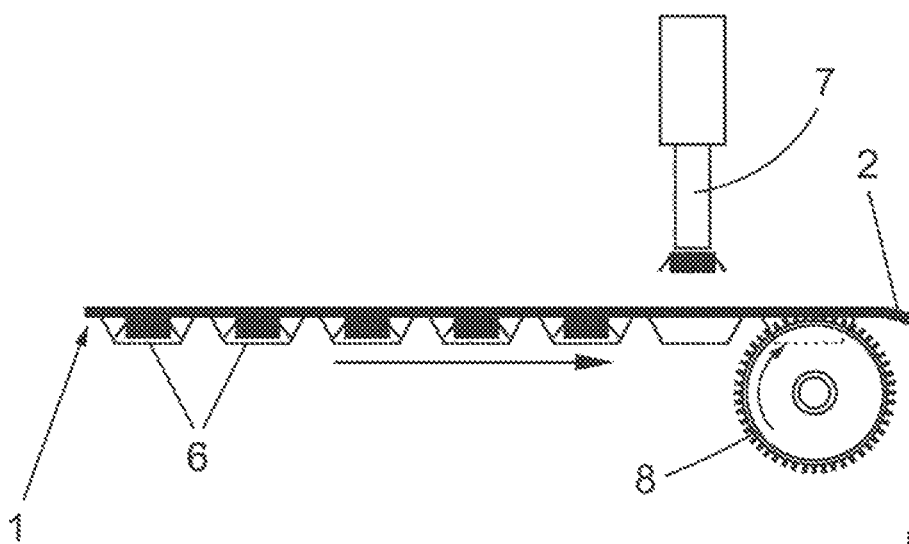
FIG. 7 illustrates an electronic component tape in conjunction with a pick-and-place SMD machine.

FIG. 7 shows a typical pick-and place suction nozzle 7 picking up an electronic component from one of the pockets 6 in the component tape 1 as it is advanced by the feeder wheel 8.

It has now been realized that previous work delays are unnecessary when using this type of simple, small tape guide with no moving parts (which is still capable of removing the cover tape, or film, holding the components in their pockets)/It has been realized that the tape guide can be pre-threaded before storage of the reel and guide as a packet.

An automated storage tower 93 as illustrated in FIGS. 1A and 1B is used to warehouse and retrieve in an ordered manner up to 546 reels of tape. Although this specific example mentions a storage tower, it should be kept in mind that the invention is not limited to the use of just a storage tower, but is equally applicable, as the person skilled in the art will realize, to other storage units such as other forms of automated warehouses etc. According to the technology disclosed, when stocking the tower with various component tapes, teach tape is code-linked to a proper tape guide and threaded guide, is placed on a pallet whereupon the pallet is deposited on the entry surface of the storage tower and the automated tower picks up the pallet and stores it in its proper location within the tower.

It has also been realized that after a certain SMT job has been completed the reel and its tape guide still threaded can be returned as a packet, suitably on the pallet to the SMD Tower or other storage unit. The threading will thus only have to been done once for an entire reel, thus saving time and reducing waste since threading can involve advancing the tape and thus wasting a few of the first components.

It will be understood by the person skilled in the art that there are several possibilities for transport, storage and retrieval of the reel and tape guide packet within the scope of the invention. In one alternative, the reel and tape guide packet, without any underlying pallet, form a coherent packet and are deposited at the entry port 97 of the SMD Tower and the internal robot arm therein picks up the packet and deposits it at the proper storage location.

It is of course possible to use other attachment means to affix the pallets in their places on the interior of the storage tower. Different forms of hooks, latches and electromagnets will be easily realized by the person skilled in the art when he wishes to implement the technology disclosed. FIGS. 3-5 illustrate a storage tower which holds several tower frame posts 99. The tower frame posts are on the interior of this tower.

As mentioned above, a pallet may be used in an automated component tape reel storage device, and the pallet may further be characterized by shape defined holder portions for holding a reel of electronic component tape and for holding together therewith a tape guide with said electronic component tape threaded therethrough. According to a further implementation of the technology disclosed, the pallet carrying the reel and tape guide can be provided with means of attachment, or coupling means, adapted to attach the pallet to a corresponding means of attachment, or coupling means, in a selected place in the interior of the automatic storage device, where the two interacting means of attachment of a pallet and automatic storage device may be any means of attachment in form of magnetic, electronic and/or mechanical coupling means. Hence, the means for temporarily affixing the pallet to one of a plurality of locations on the interior of an automated storage device comprises at least one of a magnetic, electronic and/or mechanical means of attachment, or coupling means, adapted to interact with a plurality of means of attachment, or coupling means, on the interior of the automated component tape reel storage device.

According to a further implementation of the technology disclosed, an electronics component tape reel can be made integral with its tape guide and the reel can then be provided with means of attachment to a selected place in the interior of the storage tower, e.g. means of attachment in form of magnetic, electronic and/or mechanical coupling means. Thus, the means for temporarily affixing the integral unit to one of a plurality of locations on the interior of an automated storage device comprises at least one of magnetic, electronic and/or mechanical means of attachment, or coupling means, adapted to interact with a plurality of means of attachment, or coupling means, on the interior of the automated component tape reel storage device to thereby attach the integral tape guide and reel to one of said locations on the interior of said automated storage device. In this further embodiment the reel will act as its own supporting means for storage at any desired location in the interior of the SMD tower.

The invention claimed is:

1. An automated storage device for components for surface mounting or assembly of electronic circuit boards, including:
    a deposition port for automated storage and retrieval of electronic component tape reels;
    an interior of said storage device having a plurality of locations for automated storage of said component tape reels;
    a robot arm being configured for picking up, at the deposition port, pallets holding a component tape reel and moving the pallets to selected positions on the interior of the automated storage device;
    said storage device being further configured for storing the electronic component tape reels on the pallets by temporarily affixing, without shelves, the pallets to one of a plurality of locations on the interior of said automated storage device.

2. An automated storage device according to claim 1, wherein said pallets are each designed to hold a component tape reel and a pre-threaded tape guide in conjunction therewith.

3. An automated storage device according to claim 1, wherein said pallet is temporarily affixed by magnetic means to one of a plurality of locations on the interior of said automated storage device.

4. An automated storage device according to claim 2, wherein said pallet is temporarily affixed by magnetic means to one of a plurality of locations on the interior of said automated storage device.

5. An automated storage device according to claim 1, wherein said plurality of locations are more tightly spaced than the shortest height of a component or reel.

6. An automated storage device according to claim 2, wherein said plurality of locations are more tightly spaced than the shortest height of a component or reel.

7. An automated storage device according to claim 3, wherein said plurality of locations are more tightly spaced than the shortest height of a component or reel.

8. An automated storage device according to claim 1, wherein placement in said plurality of locations is variable.

9. An automated storage device according to claim 2, wherein placement in said plurality of locations is variable.

10. An automated storage device according to claim 1, further including means for temporarily affixing the pallet to one of a plurality of locations on the interior of said automated storage device comprising a pin integral with said pallet, said pin being configured to be insertable in a hole defining a selected location.

11. An automated storage device according to claim 2, further including means for temporarily affixing the pallet to one of a plurality of locations on the interior of said automated storage device comprising a pin integral with said pallet, said pin being configured to be insertable in a hole defining a selected location.

12. An automated storage device according to claim 5, further including means for temporarily affixing the pallet to one of a plurality of locations on the interior of said automated storage device comprising a pin integral with said pallet, said pin being configured to be insertable in a hole defining a selected location.

13. An automated storage device according to claim 8, further including means for temporarily affixing the pallet to one of a plurality of locations on the interior of said automated storage device comprising a pin integral with said pallet, said pin being configured to be insertable in a hole defining a selected location.

14. An automated storage device according to claim 1, further including means for temporarily affixing the pallets to one of a plurality of locations on the interior of said automated storage device, the means comprising at least one of a magnetic, electronic and/or mechanical means of attachment.

15. An automated storage device according to claim 2, further including means for temporarily affixing the pallets to one of a plurality of locations on the interior of said automated storage device, the means comprising at least one of a magnetic, electronic and/or mechanical means of attachment.

16. An automated storage device according to claim 5, further including means for temporarily affixing the pallets to one of a plurality of locations on the interior of said automated storage device, the means comprising at least one of a magnetic, electronic and/or mechanical means of attachment.

17. An automated storage device according to claim 8, further including means for temporarily affixing the pallets to one of a plurality of locations on the interior of said automated storage device, the means comprising at least one of a magnetic, electronic and/or mechanical means of attachment.

* * * * *